(12) United States Patent
Shah et al.

(10) Patent No.: US 8,847,375 B2
(45) Date of Patent: Sep. 30, 2014

(54) MICROELECTROMECHANICAL SYSTEMS EMBEDDED IN A SUBSTRATE

(75) Inventors: Milind P. Shah, San Diego, CA (US); Mario Francisco Velez, San Diego, CA (US); Fifin Sweeney, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 626 days.

(21) Appl. No.: 12/695,543

(22) Filed: Jan. 28, 2010

(65) Prior Publication Data
US 2011/0180926 A1     Jul. 28, 2011

(51) Int. Cl.
*H01L 23/02* (2006.01)
*B81C 1/00* (2006.01)

(52) U.S. Cl.
CPC ......... *B81C 1/0023* (2013.01); *B81B 2207/098* (2013.01); *B81C 2203/035* (2013.01); *B81B 2207/012* (2013.01)
USPC .......................................... 257/686; 257/777

(58) Field of Classification Search
USPC .................... 257/686, 777, 723, 724
See application file for complete search history.

(56) References Cited

U.S. PATENT DOCUMENTS

| | | | |
|---|---|---|---|
| 6,621,137 B1 | 9/2003 | Ma et al. | |
| 7,102,240 B2 | 9/2006 | Park | |
| 7,334,326 B1 | 2/2008 | Huemoeller | |
| 7,365,006 B1 | 4/2008 | Huemoeller | |
| 2006/0289995 A1 * | 12/2006 | Talalaevski et al. | 257/758 |
| 2007/0090536 A1 | 4/2007 | Sakai et al. | |
| 2008/0054759 A1 | 3/2008 | Ayazi et al. | |
| 2009/0085205 A1 * | 4/2009 | Sugizaki | 257/737 |
| 2009/0115047 A1 * | 5/2009 | Haba et al. | 257/690 |
| 2009/0127638 A1 | 5/2009 | Kilger et al. | |
| 2009/0206444 A1 | 8/2009 | Yamada et al. | |

OTHER PUBLICATIONS

International Search Report and Written Opinion—PCT/US2011/022999—ISA/EPO—Oct. 13, 2011.
"Overlay multichip module packaging for high performance MEMS instruments" by Butler, et. al in Proceedings of the 1998 44th International Instrumentation Symposium (E.I. Compendex No. 1998334257392).
"Integrated Module Board (IMB); an advanced manufacturing technology for embedding active components inside organic substrate" by Palm, et. al in Electronic Components and Technology Conference, 2004. Proceedings. 54th at 1227-1237 of vol. 2.

\* cited by examiner

*Primary Examiner* — S. V. Clark
(74) *Attorney, Agent, or Firm* — Michelle S. Gallardo

(57) ABSTRACT

An integrated circuit package includes a microelectromechanical systems (MEMS) device embedded in a packaging substrate. The MEMS device is located on a die embedded in the packaging substrate and covered by a hermetic seal. Low-stress material in the packaging substrate surrounds the MEMS device. Additionally, interconnects may be used as standoffs to reduce stress on the MEMS device. The MEMS device is embedded a distance into the packaging substrate leaving for example, 30-80 microns, between the hermetic seal of the MEMS device and the support surface of the packaging substrate. Embedding the MEMS device results in lower stress on the MEMS device.

15 Claims, 4 Drawing Sheets

MICROELECTROMECHANICAL SYSTEMS EMBEDDED IN A SUBSTRATE

TECHNICAL FIELD

The present disclosure generally relates to integrated circuits (ICs). More specifically, the present disclosure relates to packaging integrated circuits.

BACKGROUND

Manufacturing smaller IC packages results in a final end product proportionally reduced in size. However, in today's integrated circuit (IC) packages, microelectromechanical systems (MEMS) devices (such as a SAW filter) are conventionally mounted on top of a packaging substrate supporting the IC. In this case, the MEMS devices occupy area in the package that may otherwise be used for additional integrated circuitry or eliminated to reduce IC package size. Alternatively the MEMS device may be mounted in a package separate from the IC. In this case, the overall footprint of the system is still increased.

Stacking a MEMS device on an IC reduces the footprint of the IC package but increases the height and adds challenges to IC packaging. Even if height is not of concern, stacking the MEMS device on the IC may prevent stacking another IC. Another disadvantage of stacking the MEMS device on top of an IC is increased stress on the MEMS device resulting from over-mold, which is part of the packaging process.

Although dies have been embedded in packaging substrates to reduce the overall size, MEMS devices have not been considered as candidates for embedding. MEMS devices include many mechanical structures that are sensitive to stress. High stresses created by the manufacturing process for embedding prevents MEMS devices from being embedded. Additionally, during operation environmental factors (e.g., temperature) would add stress to the embedded MEMS device. For example, stresses from the bottom and top surfaces of the package would be transferred to the MEMS device, reducing performance or otherwise impacting operation of the MEMS device.

Thus, it would be desirable to reduce the size of packages including MEMS devices without overly stressing the MEMS device.

BRIEF SUMMARY

According to one aspect of the disclosure, an integrated circuit package includes a packaging substrate. The integrated circuit package also includes a microelectromechanical systems (MEMS) device embedded in the packaging substrate.

According to another aspect of the disclosure, a method of manufacturing an integrated circuit (IC) package includes embedding a microelectromechanical systems (MEMS) device in a packaging substrate.

According to a further aspect of the disclosure, an integrated circuit package includes a microelectromechanical systems (MEMS) device embedded in a packaging substrate. The integrated circuit package also includes means for reducing stress on the MEMS device.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Embedding microelectromechanical systems (MEMS) devices in a packaging substrate reduces stress on the MEMS devices. For example, molding compound used during packaging does not contact the embedded MEMS devices. Material in the packaging substrate surrounding the embedded MEMS devices may be selected to further reduce stress on the MEMS devices. The material in the packaging substrate also acts as a sealant protecting the embedded MEMS device from contamination. Additionally, embedding the MEMS device in the packaging substrate reduces a footprint of the packaged IC without increasing height of the packaged IC.

Figure 1:
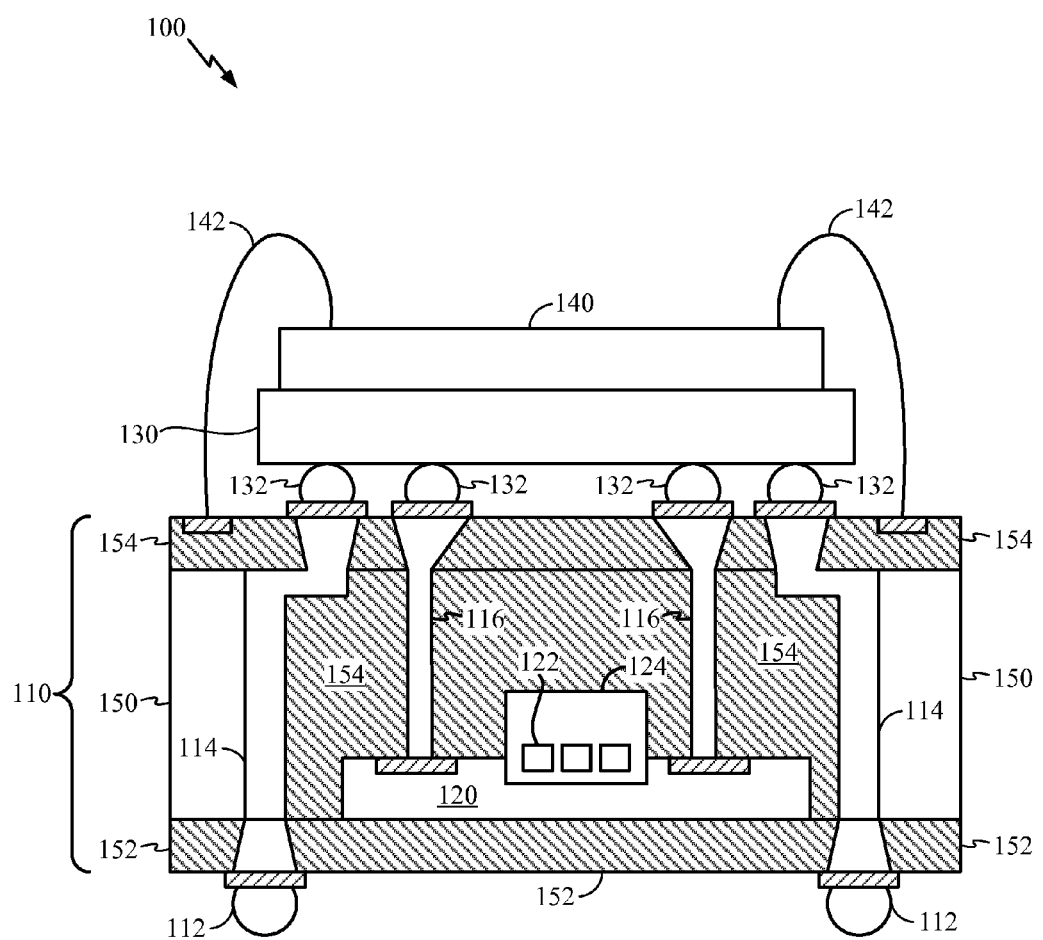
FIG. 1 is a cross-sectional view of a microelectromechanical system embedded in a substrate according to one embodiment.

FIG. 1 is a cross-sectional view of MEMS devices embedded in a substrate according to one embodiment. A packaged semiconductor device 100 includes a packaging substrate 110 and a packaging connection 112. The packaging substrate 110 includes laminates 152, 154 and a core 150. Although the laminates 152, 154 and core 150 are shown as different elements, in some embodiments some or all of these components are the same material.

A die 130 is coupled to the packaging substrate 110 through an interface connection 132. A second die 140 is mounted on the die 130 and coupled to the packaging substrate 110 through wire bonds 142. Through vias 114 couple the die 130 to the packaging connection 112.

In another embodiment, the die 130 includes through silicon vias (not shown) coupled to the interface connection 132 and the die 140. The through silicon vias may replace some or all of the wire bonds 142. Although the terminology "through silicon via" includes the word silicon, it is noted that through silicon vias are not necessarily constructed in silicon. Rather, the material can be any device substrate material.

A die 120 is embedded in a cavity of the core 150. The embedded die 120 includes MEMS devices 122 in a hermetic seal 124. Although multiple MEMS devices 122 are shown only one may be present. The MEMS devices 122 may be, for example, a switcher, surface acoustic wave (SAW) filters, thin film bulk acoustic resonators (FBAR), accelerometers, or other micromechanical systems. The hermetic seal 124 protects the MEMS devices 122 and may be, for example, silicon nitride, silicon oxide, polyimide, and/or organic materials. Other circuitry (not shown) may be located on the embedded die 120.

Standoffs 116 provide space between the embedded die 120 and a surface of the packaging substrate 110 to reduce stress on the MEMS devices 122. Stress in materials increases at interfaces between materials. For example, at the exposed surface of the laminate 154 stress is higher than stress in the bulk region of the laminate 154. According to one embodiment, the standoffs 116 also provide an electrical path between the embedded die 120 and the die 130.

The laminates 152, 154 surround the embedded die on all sides. The laminate 152 supports the embedded die 120. The laminate 154 fills the cavity within the core 150 around the embedded die 120 and may be a low-stress material that further reduces stress on the MEMS devices 122. Exemplary low-stress materials may include an epoxy polymer containing glass fiber weave (e.g., BT, FR4) or an organic resin.

Location of the embedded die 120 in the packaging substrate 110 is determined, in part, based on the height of the MEMS devices 122 and the hermetic seal 124. According to one embodiment, the embedded die 120 is placed at a depth in the packaging substrate 110 to reduce stress on the MEMS devices 122. For example, the distance may be approximately 30-80 micrometers between the top of the hermetic seal 124 and the surface of the packaging substrate 110.

According to one embodiment, the depth of the MEMS devices 122 results from the thickness selected for the core. In another embodiment, the thickness of the laminate 154 in addition to the thickness of the core 150 are selected to embed the MEMS devices 122 at the appropriate depth.

Figure 2:
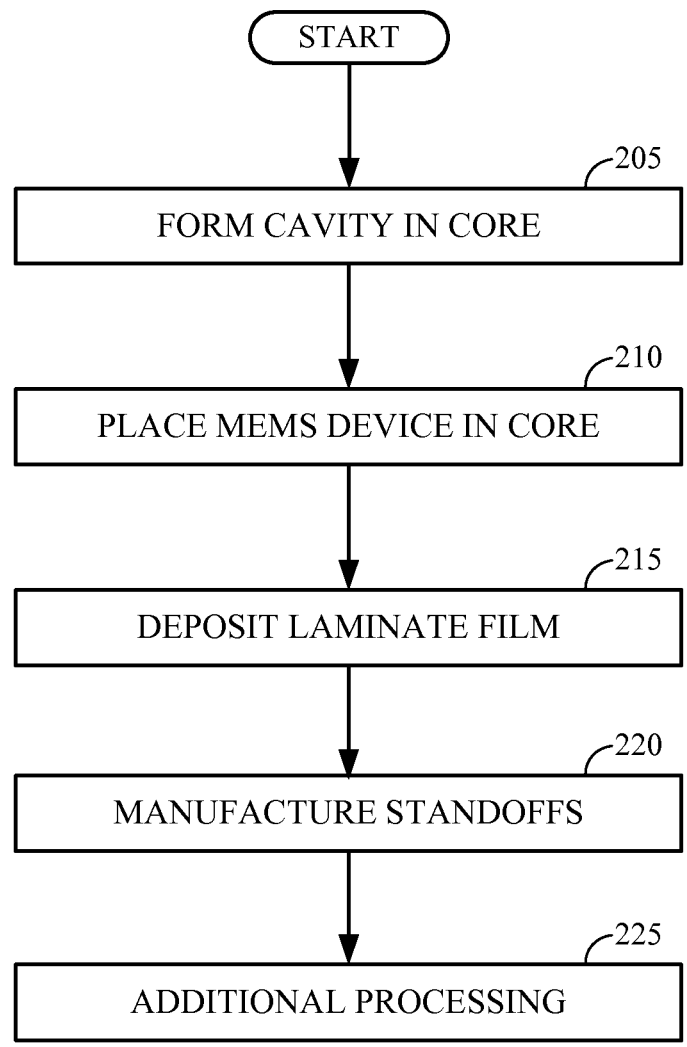
FIG. 2 is a flow chart illustrating an exemplary process for embedding MEMS devices in a packaging substrate according to one embodiment.

FIG. 2 is a flow chart illustrating an exemplary process for embedding MEMS devices in a packaging substrate according to one embodiment. At block 205 a core is received and a cavity formed in the core. The core may be, for example, an epoxy polymer containing glass fiber weave (e.g., BT, FR4). The thickness of the core is selected based, in part, on the desired distance between the MEMS devices and the top of the core. According to one embodiment, the cavity is formed to extend the entire height of the core.

At block 210, the MEMS devices are placed in the core. According to one embodiment, this is performed by placing tape on the backside of the core to support the MEMS devices during packaging. At block 215, laminate is deposited to fill the cavity in the core and, further, to form a laminate on top of the core. According to one embodiment, the laminate is chosen to be a low-stress material to reduce stress on the MEMS devices. The laminate may be, for example, organic resin or a glass film with resin.

At block 220 standoffs are manufactured to enable connectivity to the embedded die and to reduce stress on the MEMS devices.

At block 225 further processing is performed on the package. For example, the tape may be detached from the core and lamination deposited. Additionally, holes may be drilled to contact the embedded die and serve as vias. Further, interconnects such as a packaging connection, may be deposited.

Figure 3:
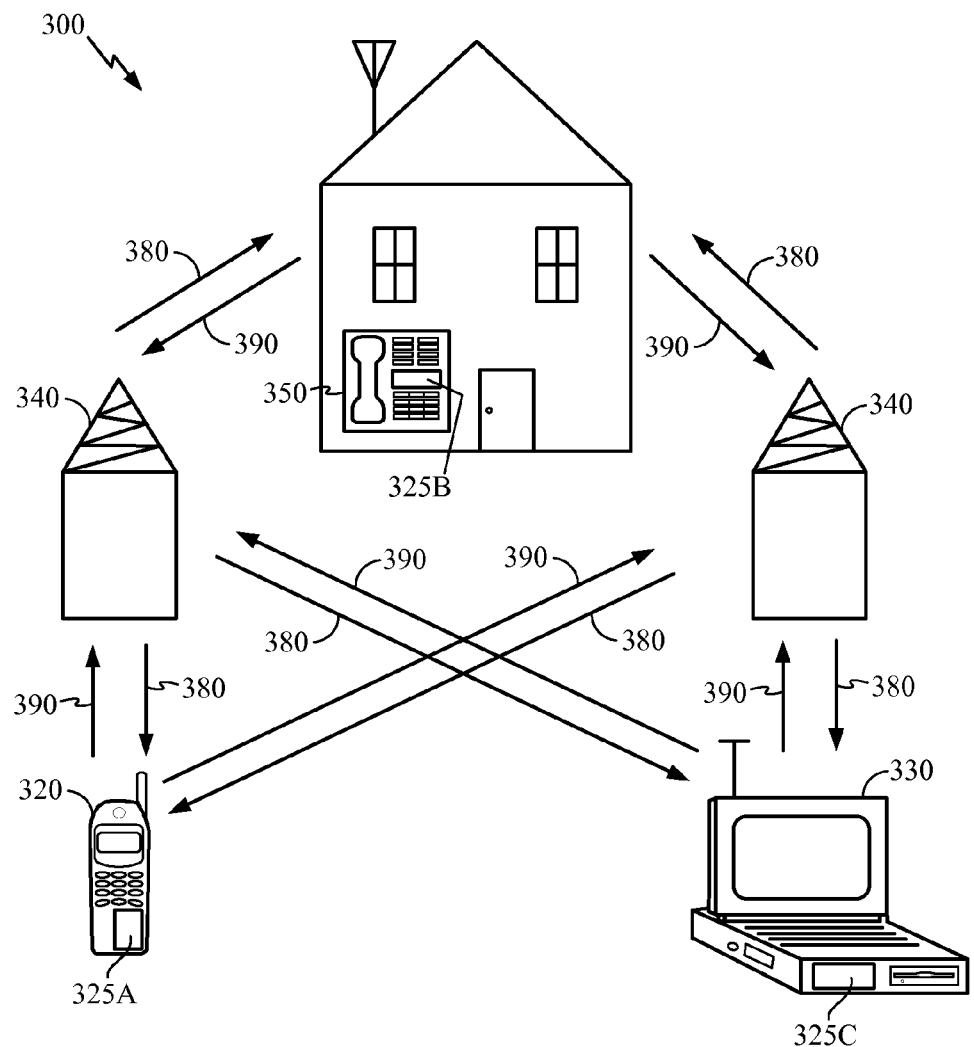
FIG. 3 is a block diagram showing an exemplary wireless communication system in which an embodiment of the disclosure may be advantageously employed.

FIG. 3 is a block diagram showing an exemplary wireless communication system 300 in which an embodiment of the disclosure may be advantageously employed. For purposes of illustration, FIG. 3 shows three remote units 320, 330, and 350 and two base stations 340. It will be recognized that wireless communication systems may have many more remote units and base stations. Remote units 320, 330, and 350 include IC devices 325A, 325B and 325C, that include the disclosed packaging. It will be recognized that any device containing an IC may also include the packaging disclosed here, including the base stations, switching devices, and network equipment. FIG. 3 shows forward link signals 380 from the base station 340 to the remote units 320, 330, and 350 and reverse link signals 390 from the remote units 320, 330, and 350 to base stations 340.

In FIG. 3, remote unit 320 is shown as a mobile telephone, remote unit 330 is shown as a portable computer, and remote unit 350 is shown as a fixed location remote unit in a wireless local loop system. For example, the remote units may be mobile phones, hand-held personal communication systems (PCS) units, portable data units such as personal data assistants, GPS enabled devices, navigation devices, settop boxes, music players, video players, entertainment units, fixed location data units such as meter reading equipment, or any other device that stores or retrieves data or computer instructions, or any combination thereof. Although FIG. 3 illustrates remote units according to the teachings of the disclosure, the disclosure is not limited to these exemplary illustrated units. Embodiments of the disclosure may be suitably employed in any device which includes ICs.

Figure 4:
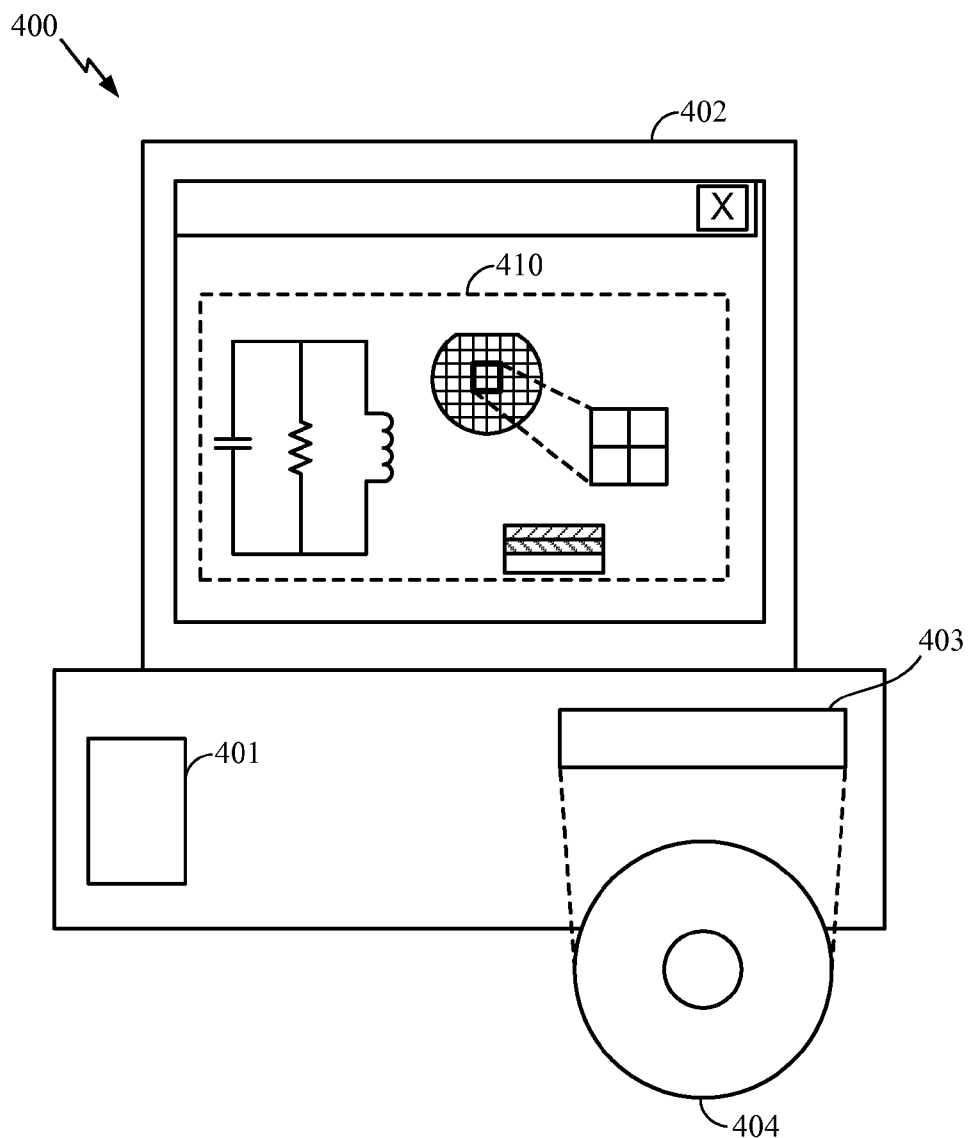
FIG. 4 is a block diagram illustrating a design workstation used for circuit, layout, and logic design of the disclosed semiconductor integrated circuit package.

FIG. 4 is a block diagram illustrating a design workstation used for circuit and layout design of the disclosed semiconductor integrated circuit package. A design workstation 400 includes a hard disk 401 containing operating system software, support files, and design software such as Cadence or OrCAD. The design workstation 400 also includes a display to facilitate design of a circuit design 410. The circuit design 410 may be the ICs with embedded MEMS devices as disclosed above. A storage medium 404 is provided for tangibly storing the circuit design 410. The circuit design 410 may be stored on the storage medium 404 in a file format such as GDSII or GERBER. The storage medium 404 may be a CD-ROM, DVD, hard disk, flash memory, or other appropriate device. Furthermore, the design workstation 400 includes a drive apparatus 403 for accepting input from or writing output to the storage medium 404.

Data recorded on the storage medium 404 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 404 facilitates the design of the circuit design 410 by decreasing the number of processes for designing semiconductor ICs.

Embedding MEMS devices in a packaging substrate reduces stress on the MEMS devices and reduces die size of the associated IC. Stress on the MEMS devices is reduced by standoffs that space the MEMS devices from the surface of the packaging substrate. Stress is also reduced by selecting an appropriate material of the packaging substrate that surrounds the embedded MEMS device. The material in the packaging substrate also acts as a sealant protecting the embedded MEMS device from contamination. Embedding MEMS devices in a packaging substrate also reduces the cost of manufacturing by eliminating an expensive die attach process.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit package, comprising:
   a packaging substrate;
   a die comprising a microelectromechanical systems (MEMS) device, at least partially embedded in the die and wherein the die and MEMS device are embedded in the packaging substrate; and
   a hermetic seal surrounding the MEMS device, the hermetic seal having a surface opposing a support surface of the packaging substrate that supports a second die.

2. The integrated circuit package of claim 1, wherein a low-stress laminate material in the packaging substrate at least partially surrounds the MEMS device.

3. The integrated circuit package of claim 2, wherein the low-stress laminate material is a resin or an epoxy polymer.

4. The integrated circuit package of claim 1, wherein the hermetic seal comprises at least one of a nitride, an oxide, or a polymer.

5. The integrated circuit package of claim 1, further comprising interconnect standoffs coupled to the die, wherein the interconnect standoffs are configured to reduce stress on the MEMS device.

6. The integrated circuit package of claim 1, wherein a distance between the surface of the hermetic seal and the support surface of the packaging substrate is established to reduce stress on the MEMS device.

7. The integrated circuit package of claim 6, wherein the distance is approximately 30-80 micrometers.

8. The integrated circuit package of claim 1, wherein the second die mounted on the packaging substrate is coupled to the MEMS device.

9. The integrated circuit package of claim 1, wherein the MEMS device is a switch, a surface acoustic wave filter, and/or thin film bulk acoustic resonator.

10. The integrated circuit package of claim 1, wherein the integrated circuit package is integrated into a cell phone, a hand-held personal communication systems (PCS) unit, a portable data unit, and/or a fixed location data unit.

11. An integrated circuit package, comprising:
    a die embedded in a packaging substrate;
    a microelectromechanical systems (MEMS) device at least partially embedded in the die, wherein the MEMS device is also embedded in the packaging substrate;
    a hermetic seal surrounding the MEMS device, the hermetic seal having a surface opposing a support surface of the packaging substrate that supports a second die; and
    means for reducing stress on the MEMS device.

12. The integrated circuit package of claim 11, wherein the means for reducing stress comprises means for distancing the MEMS device from the support surface of the packaging substrate.

13. The integrated circuit package of claim 12, wherein a distance between the hermetic seal and the support surface of the packaging substrate is approximately 30-80 micrometers.

14. The integrated circuit package of claim 11, wherein the integrated circuit package is integrated into a cell phone, a hand-held personal communication systems (PCS) unit, a portable data unit, and/or a fixed location data unit.

15. The integrated circuit package of claim 11, wherein the means for reducing stress comprises means for embedding the die and MEMS device.

* * * * *